(12) United States Patent
Jeon et al.

(10) Patent No.: US 7,998,869 B2
(45) Date of Patent: Aug. 16, 2011

(54) CONTACT PATTERNING METHOD WITH TRANSITION ETCH FEEDBACK

(75) Inventors: Byung-Goo Jeon, Fishkill, NY (US); Sung-Chul Park, Fishkill, NY (US); Nikki Edleman, Pawling, NY (US); Alois Gutmann, Heverlee (BE); Fang Chen, Singapore (SG)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 162 days.

(21) Appl. No.: 12/262,860

(22) Filed: Oct. 31, 2008

(65) Prior Publication Data

US 2010/0112729 A1    May 6, 2010

(51) Int. Cl.
*H01L 21/311* (2006.01)

(52) U.S. Cl. .......................................... 438/700

(58) Field of Classification Search ............... 438/689, 438/700, 713
See application file for complete search history.

(56) References Cited

U.S. PATENT DOCUMENTS

| | | | | |
|---|---|---|---|---|
| 6,127,278 A | * | 10/2000 | Wang et al. | 438/719 |
| 6,506,674 B2 | | 1/2003 | Ikeda et al. | |
| 2007/0224835 A1 | * | 9/2007 | Iriguchi | 438/761 |

FOREIGN PATENT DOCUMENTS

KR    1020010018821    3/2001

* cited by examiner

*Primary Examiner* — Brook Kebede
(74) *Attorney, Agent, or Firm* — F. Chau & Associates, LLC

(57) ABSTRACT

A method for forming a contact hole in a semiconductor device and related computer-readable storage medium are provided, the method and program steps of the medium including measuring a percentage of oxygen in an etching chamber, and controlling the percentage of oxygen in the etching chamber to enlarge a temporary inner diameter near a top of the contact hole.

21 Claims, 13 Drawing Sheets

CONTACT PATTERNING METHOD WITH TRANSITION ETCH FEEDBACK

BACKGROUND OF THE INVENTION

The present disclosure generally relates to metal contact etch patterning in semiconductor integrated circuits. More particularly, the present disclosure relates to metal contact etch patterning with a transition step using closed-loop feedback.

In metal contact (CA) etch patterning, the process window is quite narrow in sub-45 nm devices, for example. A typical goal is to achieve a final critical dimension (FCD) that is as small as possible without incurring an open-failure, such that an overlay margin can be extended. Earlier approaches to the etch process generally had to shrink the critical dimension (CD) over a 20 nm bias. Thus, polymerizing gas chemistry has been applied to the etch process. Prior approaches attempted to pre-select a gas flow rate to achieve such a CD. Unfortunately, the smaller the CD using this approach, the higher the risk of open-failures.

SUMMARY OF THE INVENTION

These and other issues are addressed by methods for contact patterning with transition etch feedback. Exemplary embodiments are provided.

An exemplary embodiment method for forming a contact hole in a semiconductor device includes measuring a percentage of oxygen in an etching chamber, and controlling the percentage of oxygen in the etching chamber to enlarge a temporary inner diameter near a top of the contact hole.

Other exemplary embodiments further include methods wherein the enlarged temporary inner diameter near the top of the contact hole increases a flow of etchant to a bottom of the contact hole; methods wherein the enlarged temporary inner diameter near the top of the contact hole is less than a developed critical dimension (DCD); methods wherein the enlarged temporary inner diameter near the top of the contact hole is less than a final critical dimension (FCD); methods further comprising determining an optimal flow of etchant to a bottom of the contact hole, wherein the percentage of oxygen is controlled to optimize the flow of etchant to the bottom of the contact hole; methods further comprising comparing the temporary inner diameter near the top of the contact hole with a developed critical dimension (DCD), wherein the percentage of oxygen is controlled to increase the dimension near the top of the contact hole without reaching the DCD; methods wherein the contact hole is one of a plurality of contact holes, and the percentage of oxygen is controlled to substantially equalize the temporary inner diameters near the tops of each of the plurality of contact holes, respectively; methods wherein enlarging the top of the contact hole reduces a residue restriction near the top of the contact hole.

Additional exemplary embodiments further include methods wherein enlarging the top of the contact hole reduces a polymer or polymer-like restriction near the top of the contact hole; methods further comprising comparing a polymer-restricted dimension near the top of the contact hole with a developed critical dimension (DCD), wherein the percentage of oxygen is controlled to reduce without eliminating the polymer restriction; methods wherein the contact hole is one of a plurality of contact holes, and the percentage of oxygen is controlled to substantially equalize polymer restrictions in each of the plurality of contact holes, respectively; methods wherein controlling the percentage of oxygen takes place in a transition step after a first oxide etch and before a second oxide etch; methods wherein controlling the percentage of oxygen comprises controlling the ratio of carbon-fluoride (C4F6) gas to oxygen (O2) gas; methods further comprising controlling a process time for each of a plurality of flow rates through the enlarging temporary inner diameter near the top of the contact hole.

Still other exemplary embodiments further include methods wherein the oxygen percentage and process time are control variables optimized to obtain a desired final critical dimension (FCD) at the bottom of the contact hole; methods wherein a resulting critical dimension at the top of the contact hole is no greater than a developed critical dimension (DCD) at the top of the contact hole; methods wherein a declination angle between a resulting critical dimension at the top of the contact hole and a final critical dimension (FCD) at the bottom of the contact hole is no less than 88 degrees; methods wherein a final critical dimension (FCD) at a bottom of the contact hole is large enough to substantially prevent open circuit failures.

Still additional exemplary embodiments further include methods wherein the semiconductor device is a 45 nm device and the final critical dimension (FCD) at a bottom of the contact hole is at least 50 nm; methods further comprising controlling a process time for each of a plurality of flow rates through the enlarging temporary inner diameter near the top of the contact hole, wherein the oxygen percentage and process time are control variables optimized to obtain a desired final critical dimension (FCD) at the bottom of the contact hole, and wherein the oxygen percentage and process time control variables are further optimized to obtain a desired resulting critical dimension at the top of the contact hole; methods wherein a resulting critical dimension at the top of the contact hole is small enough to prevent short circuit failures; and methods wherein the semiconductor device is a 45 nm device and a resulting critical dimension at the top of the contact hole is less than 65 nm.

Exemplary computer-readable storage medium embodiments include program steps comprising measuring a percentage of oxygen in an etching chamber, and controlling the percentage of oxygen in the etching chamber to enlarge a temporary inner diameter near a top of the contact hole.

The present disclosure will be further understood from the following description of exemplary embodiments, which is to be read in connection with the accompanying drawings.

BRIEF DESCRIPTION OF THE DRAWINGS

The present disclosure provides methods and apparatus for contact patterning with transition etch feedback in accordance with the following exemplary figures, in which.

DETAILED DESCRIPTION OF PREFERRED EMBODIMENTS

A method is provided for forming semiconductor integrated circuits with metal contact (CA) etch patterning. Exemplary embodiments provide a metal contact etch patterning method with a transition etch step for sub-45 nm logic devices.

A polymer build-up near the top of a contact hole affects flow during subsequent etching and deposition processes, and thereby affects the final contact; but the polymer build-up itself is only temporary. Embodiments of the present disclosure may control the oxygen (O2) ratio to increase a critical dimension (CD) at the bottom of the contact. More O2 opens the top of the contact hole so that more etchant reaches the bottom to increase the CD and prevent open failures. In a preferred operating range where some polymer is removed and some remains, less O2 yields a smaller bottom CD, while more O2 yields a larger bottom CD. This is because, all else being equal, more O2 eats away more of the polymer at the top of the contact hole. An exemplary process controls the percentage of C4F6 to O2 to maximize the bottom CD and prevent open failures without causing short failures. This process controls the bottom CD more precisely than was possible without controlling the percentage of oxygen.

Figure 1:
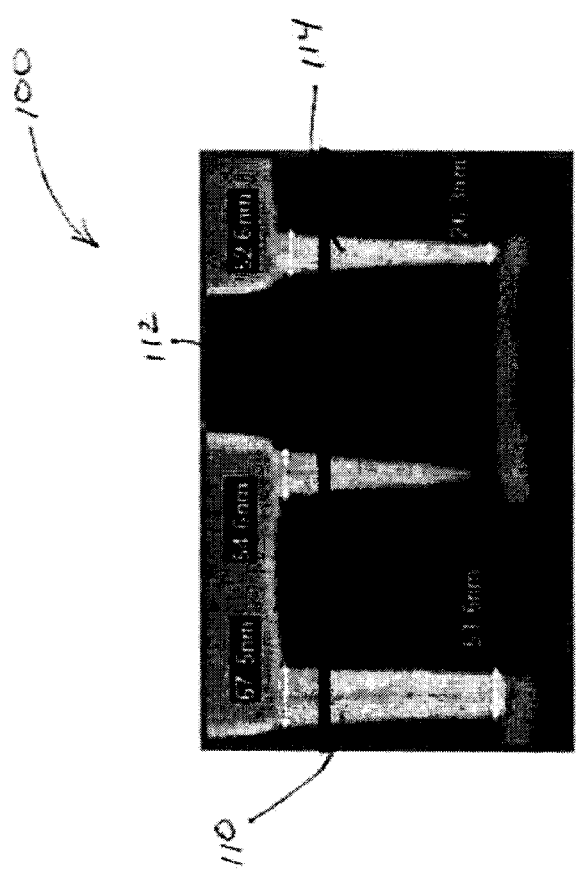
FIG. 1 shows a schematic side view of a sub-45 nm semiconductor integrated circuit.

As shown in FIG. 1, a sub-45 nm device, shown here in a side view, is indicated generally by the reference numeral 100. The device 100 includes first, second and third metal contacts 110, 112 and 114, respectively. The first metal contact 110 has a top critical dimension (CD) of 67.5 nm and a bottom CD of 53.6 nm. A second metal contact 112 has a top CD of 54.6 nm and a bottom CD of zero. That is, the second metal contact 112 has an open failure. A third metal contact 114 has a top CD of 52.6 nm, which is smaller than the top CD of the second metal contact, but has a workable bottom CD of 26.3 nm.

Figure 2:
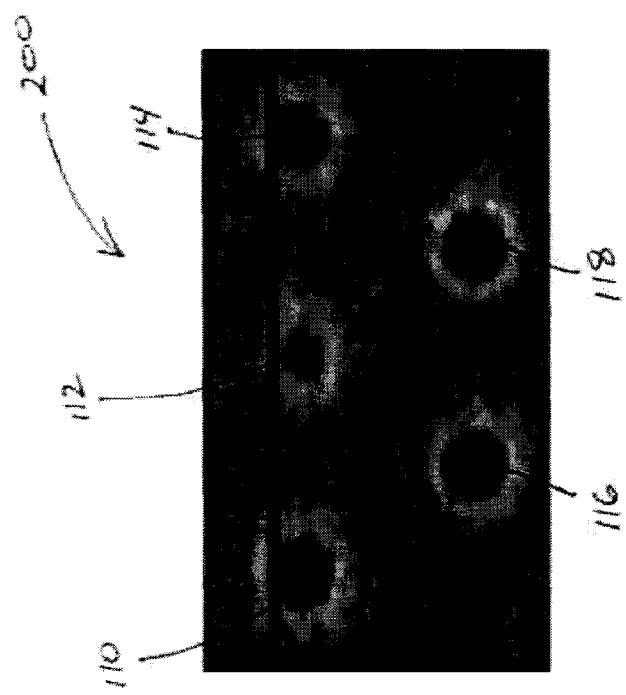
FIG. 2 shows a schematic bottom view of the sub-45 nm device of FIG. 1, taken from a reference line at about the midsections of the metal contacts.

Turning to FIG. 2, the sub-45 nm device of FIG. 1, shown here in a bottom view through about the midsections of the metal contacts, is indicated generally by the reference numeral 200. The device 200 includes first through fifth metal contacts, 110, 112, 114, 116 and 118, respectively. Here, the contacts 110, 114, 116 and 118 are robust, but the second contact 112 is already too restricted.

Figure 3:
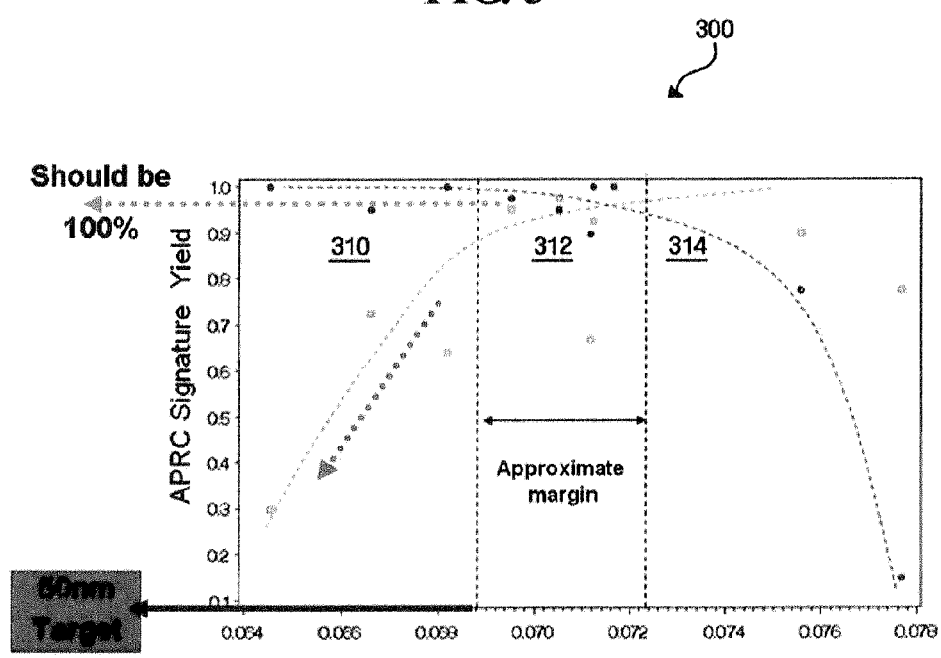
FIG. 3 shows a plot of yield versus critical dimension (CD) for sub-45 nm devices without transition etch feedback.

Turning now to FIG. 3, a plot of yield versus CD without transition etch feedback is indicated generally by the reference numeral 300. Here, a region 310 has a relatively small CD, but a high incidence of open-circuit failures. A region 312 has a medium CD, and a lower number of failures within its approximate margin. A region 314 has a relatively large CD, but a high incidence of short-circuit failures.

Random open failures typically occur in the metal contact pattern because the process window is so narrow in sub-45 nm devices. It is desirable to achieve a final critical dimension (FCD) that is as small as possible without incurring open failures, particularly so that an overlay margin can be extended. General etch processes have had to shrink the CD over about a 20 nm bias. Thus, polymerizing gas chemistry is generally applied to etch processes. A lot of time and effort is typically devoted to pre-selecting the most desirable gas flow rate to reduce failures for a given integrated circuit design. Unfortunately, the smaller the CD, the higher the risk of random open failures due to polymer bridging.

Figure 4:
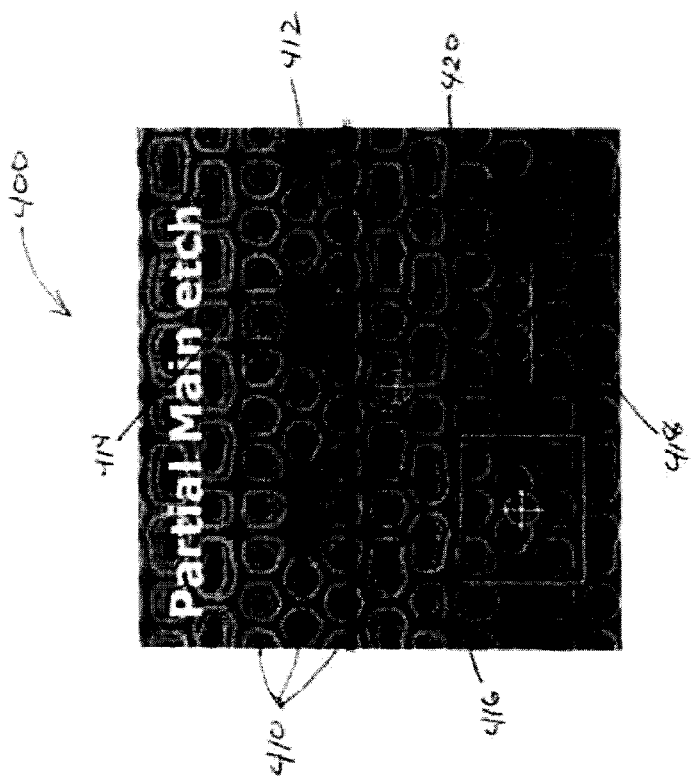
FIG. 4 shows a schematic top view of a sub-45 nm device, including contact holes with polymer bridging.

As shown in FIG. 4, a sub-45 nm device, shown here in a top view, is indicated generally by the reference numeral 400. The device 400 includes a plurality of etched contact holes 410, including contact holes 412 through 420 that show signs of polymer bridging.

Figure 5:
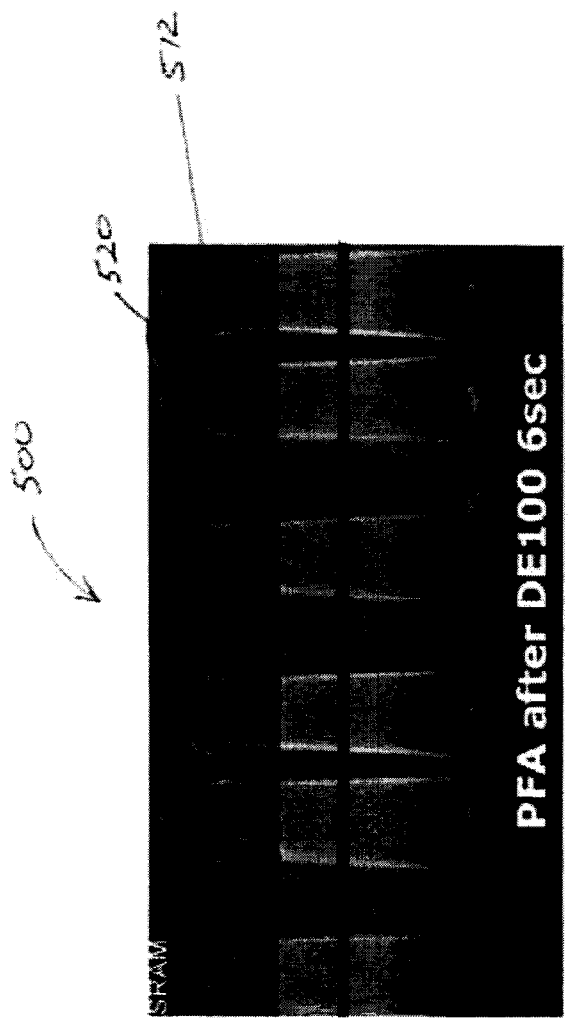
FIG. 5 shows a schematic side view of the sub-45 nm device of FIG. 4.

Turning to FIG. 5, the sub-45 nm device 400 of FIG. 4, shown here in a side view, is indicated generally by the reference numeral 500. Here, the partially bridged contact hole 412 of FIG. 4 is indicated by the reference numeral 512. A ring of polymer-like material 520 partially restricts the top opening of the contact hole 512.

Figure 6:
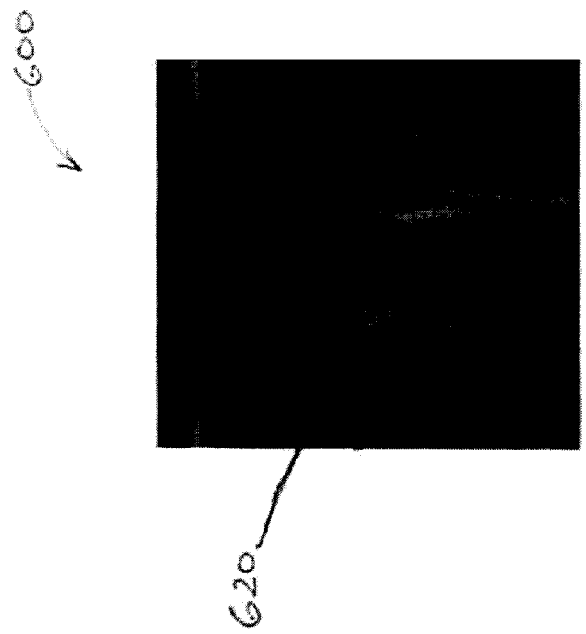
FIG. 6 shows a schematic side view of a contact hole of FIG. 5.

Turning now to FIG. 6, the contact hole 512 of FIG. 5, shown her in a side view, is indicated generally by the reference numeral 600. Here, the contact hole 600 exhibits a polymer build-up 620, which significantly reduces the internal diameter near the top of the hole.

During the main or oxide etch, a polymer or polymer-like by-product generally builds up on a top edge area of the contact holes. Thus, there is typically a bridging in the top corner area by a polymer-like material that builds up during the main etch. Such bridging significantly contributes to the open-circuit failures of the resulting metal contact patterns, although such failures are generally known as "random open failures".

In particular, whenever an attempt is made to shrink the mask layer CD, such random open failures may occur. The root cause can originate from a TLR etch, but generally gets worse during the main etch. The overhang-like build-up of polymer has the disadvantage that it restricts the flow of etchant from the top to the bottom of the contact hole. Thus, sufficient etchant may not get through to the bottom, and this results in an open failure for the resulting metal contact. In the present disclosure, the build-up of polymer is controlled in a transition step to achieve shrinkage gain and substantially avoid open failures due to bridging.

Figure 7:
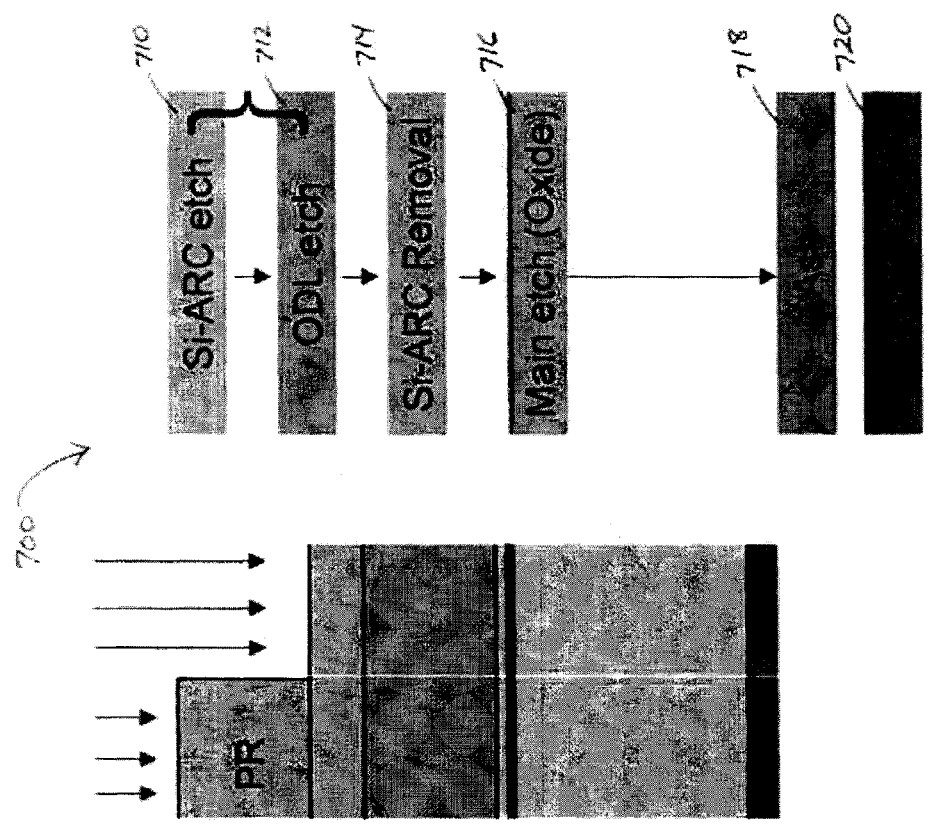
FIG. 7 shows a process flowchart for metal contact patterning.

As shown in FIG. 7, a process flowchart for metal contact patterning is indicated generally by the reference numeral 700. Here, a function block 710 performs a Si-ARC etch, and passes control to a function block 712. The function block 712 performs an ODL etch, and passes control to a function block 714. The function block 714, in turn, performs a Si-ARC removal, and passes control to a function block 716. The function block 716 performs a main or oxide etch, and passes control to a function block 718. The function block 718 performs an ashing step, and passes control to a function block 720. The function block 720, in turn, performs a SiN etch.

The process 700 relies on the tri-layer etch, particularly blocks 710 and 712, as the key to controlling CD. While this is a reasonable approach, defining a smaller bottom CD for the tri-layer hardly avoids the risk of open failures during the main etch 716.

Figure 8:
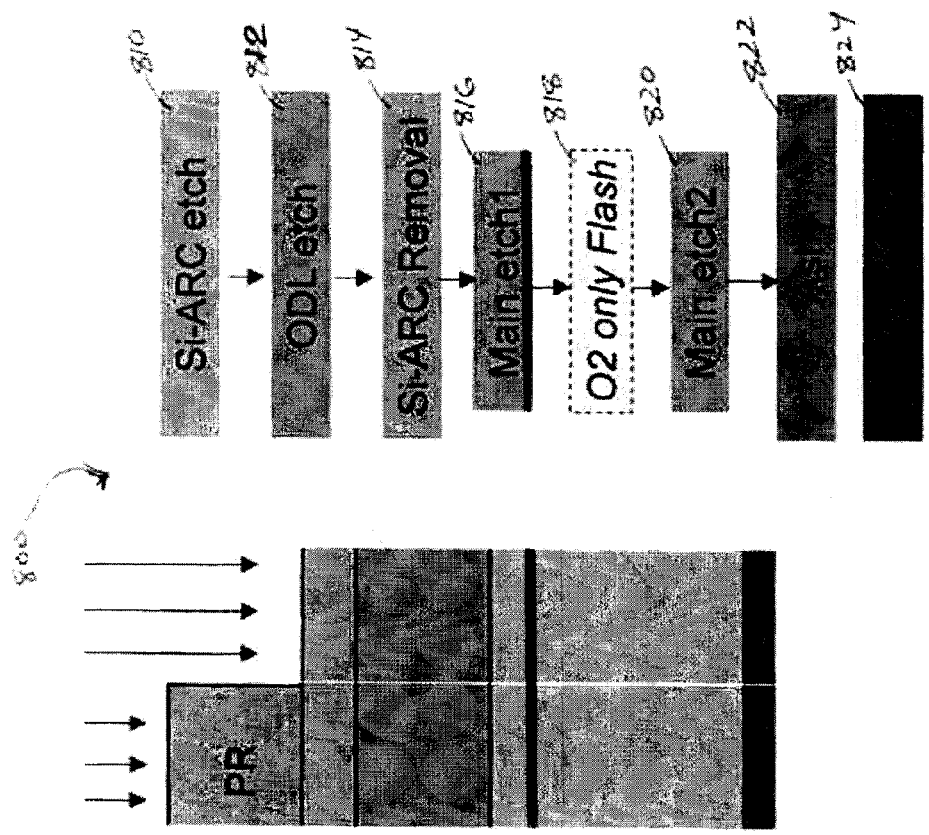
FIG. 8 shows a process flowchart for metal contact patterning with an oxygen (O2) flash.

Turning to FIG. 8, a process flowchart for metal contact patterning with an oxygen (O2) flash, which entirely removes the polymer build-up, is indicated generally by the reference numeral 800. Here, a function block 810 performs a Si-ARC etch, and passes control to a function block 812. The function block 812 performs an ODL etch, and passes control to a function block 814. The function block 814, in turn, performs a Si-ARC removal, and passes control to a function block 816. The function block 816 performs a first main or oxide etch, and passes control to a function block 818. The function bock 818 performs an O2-only flash, and passes control to a function block 820. The function block 820, in turn, performs a second main or oxide etch, and passes control to a function block 822. The function block 822 performs an ashing step, and passes control to a function block 824. The function block 824 performs a SiN etch.

Figure 9:
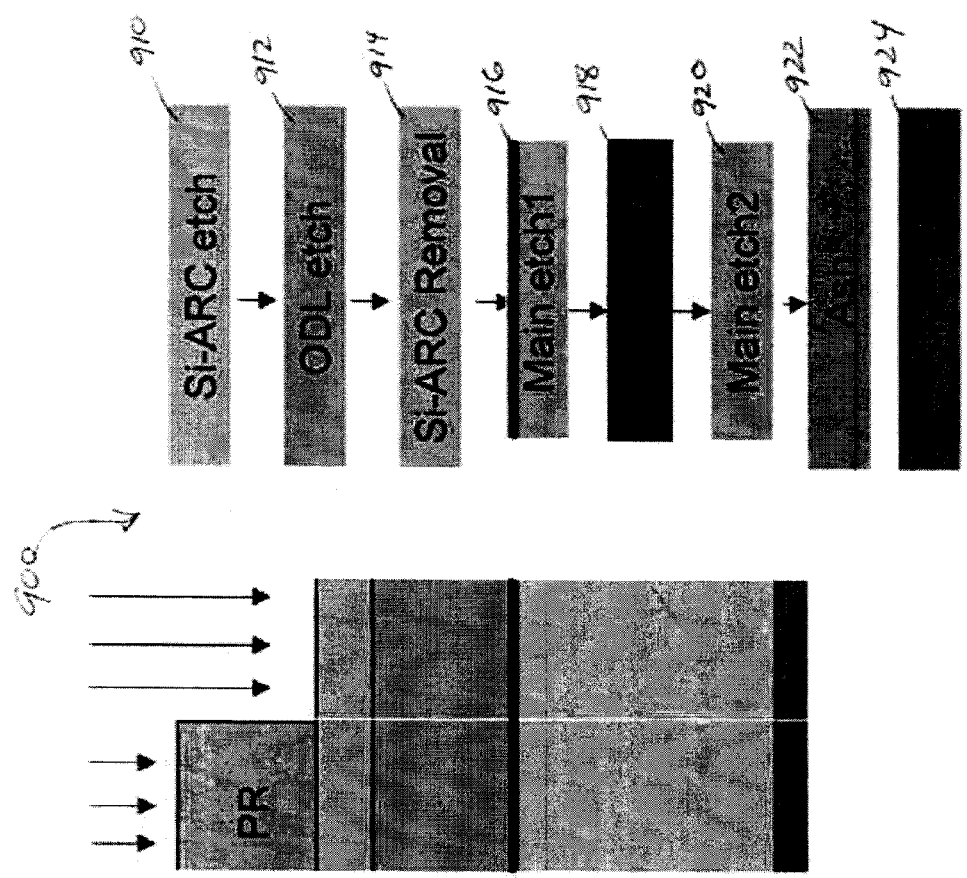
FIG. 9 shows a process flowchart for variable ratio feedback control in accordance with a preferred embodiment of the present disclosure.

Turning to FIG. 9, a process flowchart for variable ratio feedback control, which uses closed-loop feedback to control CD, is indicated generally by the reference numeral 900. Here, a function block 910 performs a Si-ARC etch, and passes control to a function block 912. The function block 912 performs an ODL etch, and passes control to a function block 914. The function block 914, in turn, performs a Si-ARC removal, and passes control to a function block 916. The function block 916 performs a first main or oxide etch, and passes control to a function block 918. The function bock 918 performs a transition step, and passes control to a function block 920. The function block 920, in turn, performs a second main or oxide etch, and passes control to a function block 922. The function block 922 performs an ashing step, and passes control to a function block 924. The function block 924 performs a SiN etch.

Here, the transition step 918 uses closed-loop feedback to control a variable ratio of O2 to C4F6 or similar gas, and further controls process time. Thus, the transition step implements a feedback loop for automatic process control (APC) of CD.

Figure 10:
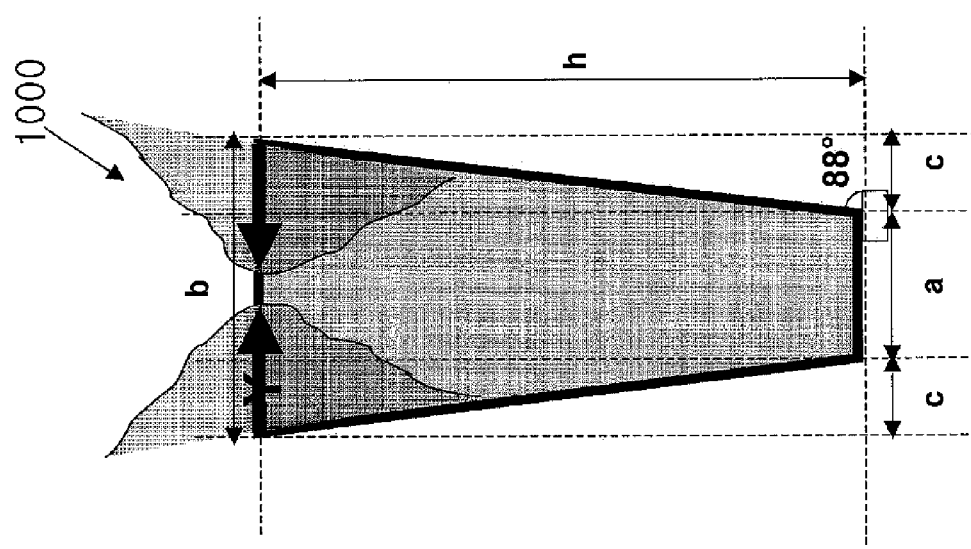
FIG. 10 shows a schematic side view of a contact hole during the transition feedback step of FIG. 9 in accordance with a preferred embodiment of the present disclosure.

As shown in FIG. 10, a contact hole during the transition feedback step 918 of FIG. 9 is indicated generally by the reference numeral 1000. The contact hole has a top FCD target of b, a reduced actual top diameter of b−2Y, where Y is the width of the remaining polymer, an ILD height of h, a bottom FCD target of a, and a slope of about h/c=2h/(b−a). The top FCD target b may also be expressed as b=2*{h/tan (α)}+a, where α is the requested profile angle. In an exemplary application, the parameter values might be a=50 nm, α=88°, h=420 nm, c=15.04 nm, and top CD b=80.01 nm.

Figure 11:
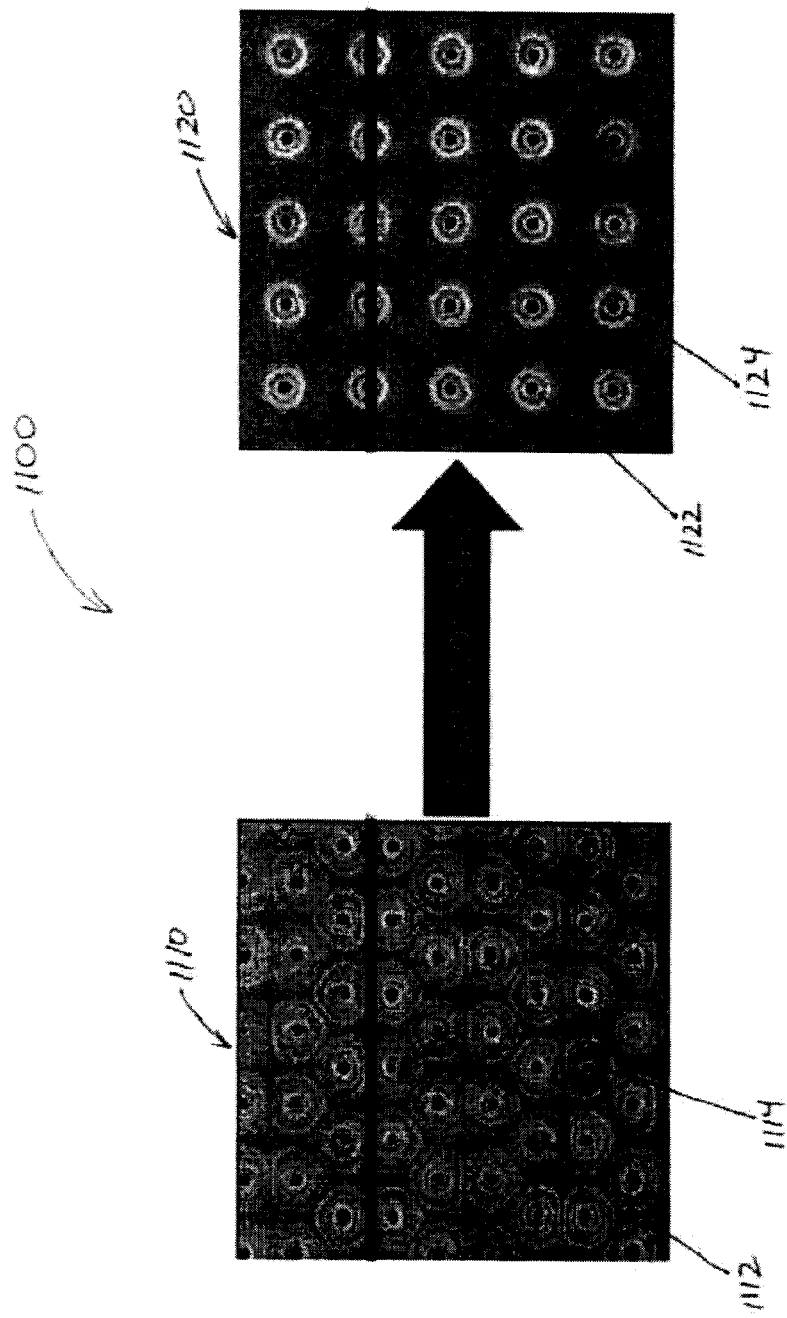
FIG. 11 shows schematic top views of a sub-45 nm device in accordance with a preferred embodiment of the present disclosure.

Turning to FIG. 11, a sub-45 nm device, shown here in top views, is indicated generally by the reference numeral 1100. The device is shown before the transition step 918 of FIG. 9 as reference numeral 1110, and after the transition step 918 of FIG. 9 as reference numeral 1120. Before the transition step, the device 1110 includes a plurality of contact holes, including contact holes 1112 and 1114 that show signs of polymer bridging. After the transition step, the device 1120 includes a plurality of optimized contact holes, including optimized contact holes 1122 and 1124 that have had some of the polymer residue removed.

Here, the remaining polymer layer Y=f(x,t) at one edge is a function of x and t, where x is the ratio of C4F6 to O2 gases, and t is the process time. Here, when the remaining polymer for both edges, 2Y=2f(x,t), is between about 60 nm and about 80 nm, open-circuit failures are too prevalent. When 2Y=2f(x,t) is between about 0 nm and about 30 nm, short-circuit failures are too prevalent. When 2Y=2f(x,t) is between about 30 nm and about 60 nm, an optimized yield may be realized by significantly reducing failures in this moderate region.

Figure 12:
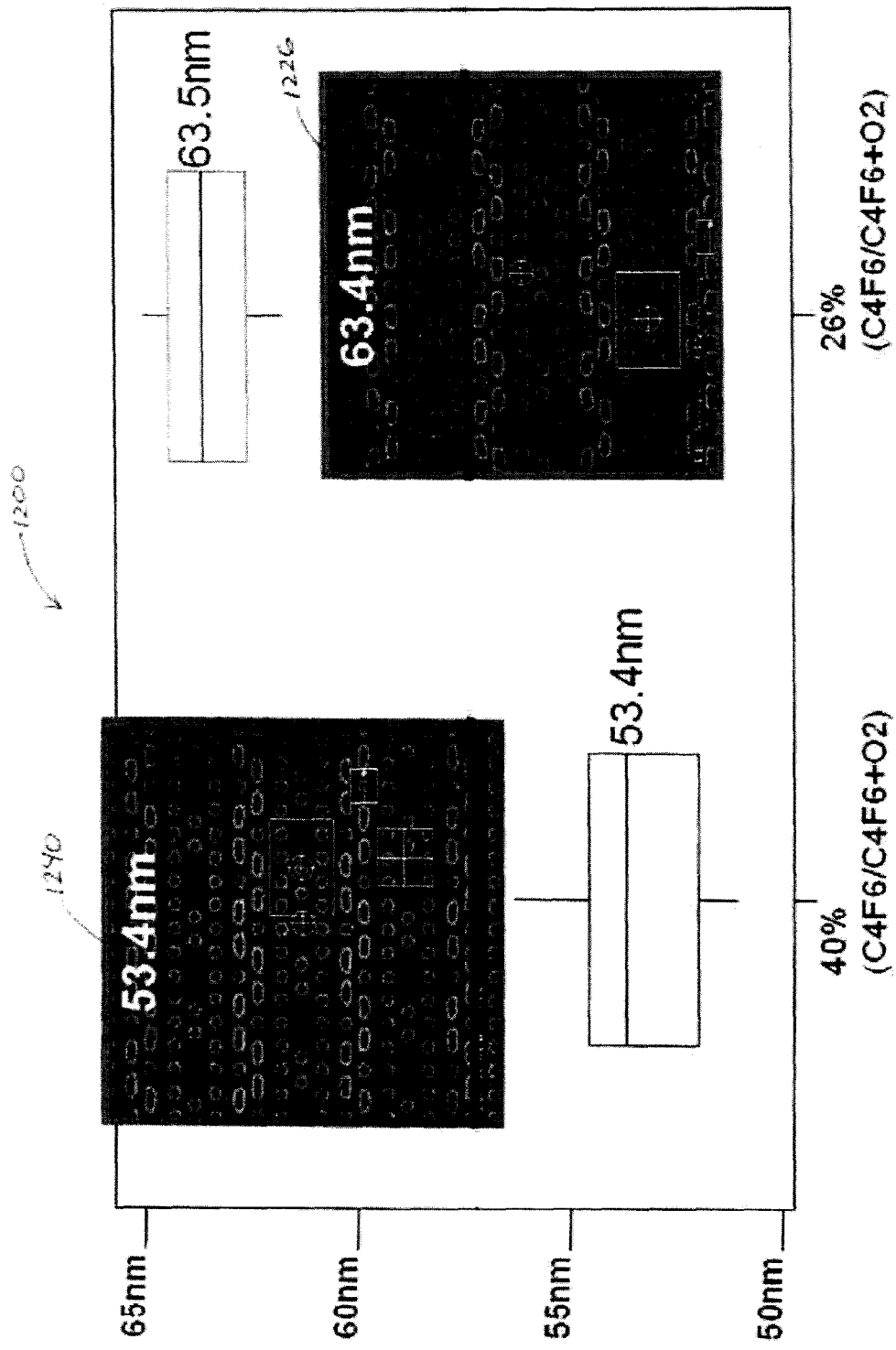
FIG. 12 shows a plot of critical dimension versus a reciprocal ratio of oxygen percentages for sub-45 nm devices in accordance with a preferred embodiment of the present disclosure.

Turning now to FIG. 12, a plot of CD versus a reciprocal ratio of oxygen percentages for sub-45 nm devices is indicated generally by the reference numeral 1200. The plot shows a control variable for gas ratio on the horizontal axis, and an output variable for CD on the vertical axis. The plot includes an illustrative top view of a device resulting from a 40% ratio of C4F6 to C4F6 plus O2, indicated by the reference numeral 1240. The device 1240 exhibits a top CD of 53.4 nm. The plot includes an illustrative top view of a device resulting from a 26% ratio of C4F6 to C4F6 plus O2, indicated by the reference numeral 1226. The device 1226 exhibits a top CD of 63.5 nm. In this exemplary application, a regulated gas ratio of about 33% was found to optimize the process yield or POR by reducing open-circuit failures without increasing short-circuit failures.

Figure 13:
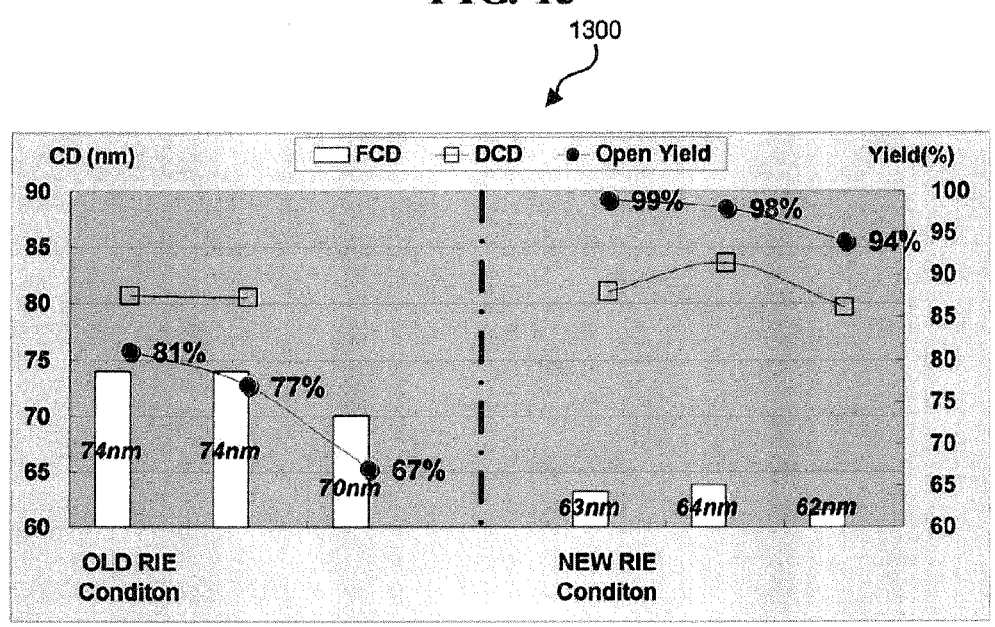
FIG. 13 shows a comparative plot for old versus new conditions on the rate of ion etch (RIE) or etch rate in accordance with a preferred embodiment of the present disclosure.

As shown in FIG. 13, a comparative plot for old versus new conditions on the rate of ion etch (RIE) or etch rate is indicated generally by the reference numeral 1300. Results were analyzed using an ES32 inspection tool. The new RIE conditions are achievable by the transition step 918 of FIG. 9.

Using the old conditions, a process batch having a final critical dimension (FCD) of 70 nm had an open yield of 67%. That is, only 67% lacked open failures. One batch having a developed CD (DCD) of 81 nm led to an FCD of 74 nm and an open yield of 81%, while another batch having a DCD of 81 nm led to an FCD of 74 nm and an open yield of 77%.

Using the new RIE conditions with closed-loop transition step, a process batch having a DCD of 79 nm led to an FCD of 62 nm with an open yield of 94%. A process batch having a DCD of 83 nm led to an FCD of 64 nm with an open yield of 98%; and a process batch having a DCD of 81 nm led to an FCD of 63 nm with an open yield of 99%.

In addition, alternate embodiments are contemplated. For example, an SRAM process embodiment of the present disclosure has produced SRAM with significantly improved yields. Although FCD was decreased by more than 13%, which would normally reduce yield by a significant amount, open yield was actually improved by as much as 30%.

Random open contact failures can result from aggressive polymer generation during an ILD oxide etch with carbon-fluoride gas chemistry, for example. The present disclosure teaches that such polymers and/or like materials may be moderately reduced at some etch time frame so that sufficient etchant will be able to pass through the top of the contact hole to reach the bottom of the contact hole and avoid open failures. The new transition step, which can control or regulate the C4F6:O2 ratio and process time using closed-loop feedback, can significantly reduce open failures and increase yield. By adjusting the C4F6:O2 gas ratio, for example, the CD bias can be more finely controlled. This process may be applied to any applicable automatic process control (APC) feedback loop, and shall not be construed as being limited to 45 nm devices, for example.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:
1. A method for forming a contact hole in a semiconductor device, comprising:
 measuring a percentage of oxygen in an etching chamber; and
 controlling the percentage of oxygen in the etching chamber to enlarge a temporary inner diameter near a top of the contact hole.

2. A method as defined in claim 1 wherein the enlarged temporary inner diameter near the top of the contact hole increases a flow of etchant to a bottom of the contact hole.

3. A method as defined in claim 1 wherein the enlarged temporary inner diameter near the top of the contact hole is less than a developed critical dimension (DCD).

4. A method as defined in claim 1 wherein the enlarged temporary inner diameter near the top of the contact hole is less than a final critical dimension (FCD).

5. A method as defined in claim 1, further comprising:
determining an optimal flow of etchant to a bottom of the contact hole,
wherein the percentage of oxygen is controlled to optimize the flow of etchant to the bottom of the contact hole.

6. A method as defined in claim 1, further comprising:
comparing the temporary inner diameter near the top of the contact hole with a developed critical dimension (DCD),
wherein the percentage of oxygen is controlled to increase the dimension near the top of the contact hole without reaching the DCD.

7. A method as defined in claim 1 wherein:
the contact hole is one of a plurality of contact holes; and
the percentage of oxygen is controlled to substantially equalize the temporary inner diameters near the tops of each of the plurality of contact holes, respectively.

8. A method as defined in claim 1 wherein enlarging the top of the contact hole reduces a residue restriction near the top of the contact hole.

9. A method as defined in claim 1 wherein enlarging the top of the contact hole reduces a polymer or polymer-like restriction near the top of the contact hole.

10. A method as defined in claim 1, further comprising:
comparing a polymer-restricted dimension near the top of the contact hole with a developed critical dimension (DCD),
wherein the percentage of oxygen is controlled to reduce without eliminating the polymer restriction.

11. A method as defined in claim 1 wherein:
the contact hole is one of a plurality of contact holes; and
the percentage of oxygen is controlled to substantially equalize polymer restrictions in each of the plurality of contact holes, respectively.

12. A method as defined in claim 1 wherein controlling the percentage of oxygen takes place in a transition step after a first oxide etch and before a second oxide etch.

13. A method as defined in claim 1 wherein controlling the percentage of oxygen comprises controlling the ratio of carbon-fluoride (C4F6) gas to oxygen (O2) gas.

14. A method as defined in claim 1, further comprising:
controlling a process time for each of a plurality of flow rates through the enlarging temporary inner diameter near the top of the contact hole,
wherein the oxygen percentage and process time are control variables optimized to obtain a desired final critical dimension (FCD) at the bottom of the contact hole.

15. A method as defined in claim 1 wherein a resulting critical dimension at the top of the contact hole is no greater than a developed critical dimension (DCD) at the top of the contact hole.

16. A method as defined in claim 1 wherein a declination angle between a developed critical dimension (DCD) at the top of the contact hole and a final critical dimension (FCD) at the bottom of the contact hole is no less than 88 degrees.

17. A method as defined in claim 1 wherein a final critical dimension (FCD) at a bottom of the contact hole is large enough to substantially prevent open circuit failures.

18. A method as defined in claim 1 wherein the semiconductor device is a 45 nm device and the final critical dimension (FCD) at a bottom of the contact hole is at least 50 nm.

19. A method as defined in claim 1, further comprising:
controlling a process time for each of a plurality of flow rates through the enlarging temporary inner diameter near the top of the contact hole,
wherein the oxygen percentage and process time are control variables optimized to obtain a desired final critical dimension (FCD) at the bottom of the contact hole, and
wherein the oxygen percentage and process time control variables are further optimized to obtain a resulting critical dimension at the top of the contact hole.

20. A method as defined in claim 1 wherein a resulting critical dimension at the top of the contact hole is small enough to prevent short circuit failures.

21. A method as defined in claim 1 wherein the semiconductor device is a 45 nm device and a resulting critical dimension at the top of the contact hole is less than 65 nm.

* * * * *